(12) United States Patent
Umemura et al.

(10) Patent No.: US 9,523,926 B2
(45) Date of Patent: Dec. 20, 2016

(54) EXPOSURE APPARATUS AND DEVICE MANUFACTURING METHOD

(75) Inventors: Atsushi Umemura, Kawasaki (JP); Noriyasu Hasegawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 572 days.

(21) Appl. No.: 13/548,362

(22) Filed: Jul. 13, 2012

(65) Prior Publication Data

US 2013/0021594 A1  Jan. 24, 2013

(30) Foreign Application Priority Data

Jul. 22, 2011  (JP) .................. 2011-160982

(51) Int. Cl.
  *G03B 27/62*  (2006.01)
  *G03F 7/20*  (2006.01)
(52) U.S. Cl.
  CPC ........... *G03F 7/707* (2013.01); *G03F 7/70875* (2013.01)
(58) Field of Classification Search
  CPC .......................... G03F 7/70875; G03F 7/707
  USPC .......................... 355/53, 75, 77, 30
  See application file for complete search history.

(56) References Cited

U.S. PATENT DOCUMENTS

| | | | |
|---|---|---|---|
| 6,192,100 B1 * | 2/2001 | Acosta et al. .................. | 378/35 |
| 8,964,166 B2 | 2/2015 | Shibazaki | |
| 2009/0207394 A1 * | 8/2009 | Shibazaki ........... | G03F 7/70875 355/53 |
| 2011/0081604 A1 * | 4/2011 | Tsukada et al. .................. | 430/5 |

FOREIGN PATENT DOCUMENTS

| | | | |
|---|---|---|---|
| JP | 05188583 A | * | 7/1993 |
| JP | 06273922 A | * | 9/1994 |
| JP | 1126376 A | | 1/1999 |
| JP | 2002353127 A | | 12/2002 |
| JP | 2010045300 A | | 2/2010 |
| JP | 2011118117 A | | 6/2011 |
| JP | 2011128646 A | | 6/2011 |
| WO | 2009078422 A1 | | 6/2009 |

OTHER PUBLICATIONS

JP 2002-2353127 machine translation. Dec. 6, 2002.*
Office Action issued in JP2011-160982, mailed Apr. 28, 2015. English translation provided.

* cited by examiner

*Primary Examiner* — Peter B Kim
(74) *Attorney, Agent, or Firm* — Rossi, Kimms & McDowell LLP

(57) ABSTRACT

The exposure apparatus of the present invention has an original holding unit including a holding frame that holds an original M by attracting the outer peripheral portion thereof and a drive unit that is capable of moving the holding frame while changing an irradiation area of the light to be irradiated on a pattern. Here, the holding frame has a penetrating portion, which is capable of flowing gas which is present in a space defined by the original and the holding frame into and out from the space, provided at both front and back lateral sides of the holding frame in the direction of movement thereof, and the penetrating portion has a shape or a configuration such that the pressure loss in the flow of the gas in a first direction is less than the pressure loss in the flow of the gas in a second direction.

15 Claims, 5 Drawing Sheets

EXPOSURE APPARATUS AND DEVICE MANUFACTURING METHOD

BACKGROUND OF THE INVENTION

Field of the Invention

The present invention relates to an exposure apparatus and a device manufacturing method using the same.

Description of the Related Art

An exposure apparatus is configured to transfer a pattern of an original (reticle or mask) onto a photosensitive substrate (e.g., wafer, glass plate, and the like, where the surface thereof is coated with a resist layer) via a projection optical system in a lithography process of a manufacturing process for a semiconductor device, a liquid crystal display device, and the like. The exposure apparatus typically includes an original stage that movably holds an original. Examples of such a mechanism for holding an original onto the original stage include a mechanism utilizing a vacuum adsorption force or an electrostatic attraction force, a mechanism utilizing an actuator for generating a pressing force, or the like. In any one of these mechanisms, it is preferable that a holding surface for holding an original is the lower surface in the direction of gravity from the viewpoint of preventing an original from being dropped off by gravity.

Since the original has a circuit pattern formed thereon by maximally utilizing an inner effective area and the entire surface of the circuit pattern is irradiated with exposure light, the original is typically held by a rectangular holding frame using the outer peripheral portion of the original as a holding surface. Here, when exposure light is irradiated onto the original, a portion of exposure light is absorbed into the circuit pattern, and thus, light energy is converted into heat energy. The heat energy causes a thermal deformation of the original and is diffused into the surrounding environment through solid heat transfer via the original itself and the holding frame, convection heat transfer via the surrounding air, and radiative heat transfer. For example, gas retaining in an enclosed space between the original and the holding frame is heated by these types of heat transfer. Consequently, the gas may reduce the measurement accuracy of an alignment measurement system for performing the positioning of the original or may generate fluctuations in light directed from the original toward the projection optical system. In addition, thermal deformation of the original itself may also directly affect imaging performance. Accordingly, Japanese Patent Laid-Open No. 2002-353127 discloses an exposure apparatus that improves the recovery rate of heat accumulated in an original (reticle) by providing a flow passage for gas near the original to thereby reduce disturbances in the surrounding environment. In the exposure apparatus, thermal deformation of the original is suppressed by forcibly introducing temperature control fluid into a space between an original and an anti-adhesion film (pellicle) provided thereon. At this time, the temperature control fluid is introduced from piping directly disposed on a fixed frame (pellicle frame) for the anti-adhesion film.

However, the piping for introducing the temperature control fluid disclosed in Japanese Patent Laid-Open No. 2002-353127 is physically coupled to an original. Thus, vibration of the piping itself due to introduction of the temperature control fluid or external vibration transmitted via the piping are transmitted to the original. For example, if vibration to be transmitted to the original has a frequency from a few hundreds to a few thousands Hz, Moving Standard Deviation (MSD) which is the index affecting resolution may be deteriorated. Fluid vibration or pressure fluctuation caused by non-uniformity between the supply amount and the recovery amount of the temperature control fluid adversely affects an original, resulting in possible breakage of an anti-adhesion film. In addition, the anti-adhesion film is originally intended to prevent particles from being deposited on the original. However, deposition of particles may be promoted by introducing the temperature control fluid at the inner side of the anti-adhesion film. Furthermore, from the viewpoint of the piping implementation, the laying of the piping near the original stage becomes complicated, resulting in an increase in a mechanical load on the original stage. If such a configuration is applied, the piping must be detached during the exchange of the original, not only resulting in a redundancy of an original conveyance mechanism but also causing the occurrence of particles.

SUMMARY OF THE INVENTION

The present invention has been made in view of the circumstances described above and provides an exposure apparatus that is advantageous for suppressing the effects of heat and vibration on an original.

According to an aspect of the present invention, an exposure apparatus that irradiates a pattern formed on an original with light emitted from an illumination system, projects an image of the pattern on a substrate via a projection optical system, and exposes the substrate is provided that includes an original holding unit including a holding frame that holds the outer peripheral portion of the original and a drive unit that is capable of moving the holding frame in a first direction and a second direction opposite to the first direction, wherein the holding frame has a penetrating portion, which is capable of flowing gas which is present in a space defined by the original and the holding frame into and out from the space, provided at both front and back lateral sides of the holding frame in the direction of movement thereof, and the penetrating portion has a shape or a configuration such that the pressure loss in the flow of the gas in the first direction is less than the pressure loss in the flow of the gas in the second direction.

According to the present invention, an exposure apparatus that is advantageous for suppressing the effects of heat and vibration on an original may be provided.

Further features of the present invention will become apparent from the following description of exemplary embodiments with reference to the attached drawings.

DESCRIPTION OF THE EMBODIMENTS

Hereinafter, preferred embodiments of the present invention will now be described in detail with reference to the accompanying drawings.

First Embodiment

Figure 1:
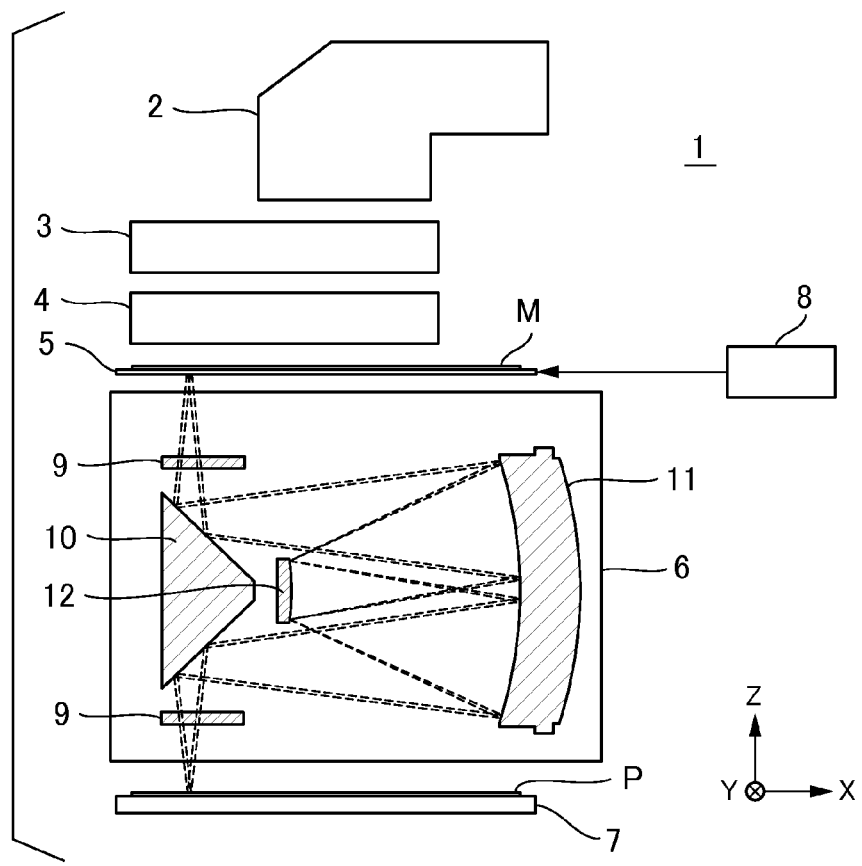
FIG. 1 is a diagram illustrating the configuration of an exposure apparatus according to one embodiment of the present invention.

Firstly, a description will be given of an exposure apparatus according to the first embodiment of the present invention. FIG. 1 is a schematic diagram illustrating the configuration of an exposure apparatus 1 according to the present embodiment. The exposure apparatus 1 is a scanning type exposure apparatus that performs synchronous scanning of a mask (original) and a glass plate (substrate) serving as a substrate to be treated to thereby expose a pattern formed on the mask to the glass plate. Firstly, the exposure apparatus 1 includes an illumination optical system 2, an expanding optical system 3, an alignment measurement system 4, a mask stage 5 that holds a mask M on which a predetermined pattern is formed, a projection optical system 6, a substrate stage 7 that holds a glass plate P on which a photosensitive agent is applied, and a control unit 8.

The illumination optical system (illumination system) 2 has a light source (not shown) and irradiates the mask M held by the mask stage 5 with slit-like exposure light to thereby project a pattern image formed on the mask M onto the glass plate P (onto the substrate) via the projection optical system 6. As a light source, an Hg lamp may be employed but a portion of an output wavelength (e.g., i-ray, h-ray, g-ray, or the like) of an Hg lamp may also be employed. The expanding optical system 3 expands exposure light beam irradiated from the illumination optical system 2. The alignment measurement system 4 observes positioning alignment marks formed on the mask M and the glass plate P, respectively. In this case, the alignment measurement system 4 has a configuration which is capable of driving a part or the whole thereof so as to be retracted outside the exposure light beam irradiation area as appropriate such that exposure light is not shielded thereby when the illumination optical system 2 irradiates exposure light onto the mask M. A mask stage (original holding unit) 5 is movable within the X-Y plane while holding the mask M. The configuration and operation of the mask stage 5 will be described in detail below. The projection optical system 6 projects a pattern image onto the glass plate P on the substrate stage 7, and includes a flat plate-type transmission element 9, a reflection mirror 10, a concave mirror 11, and a convex mirror 12 therein. The flat plate-type transmission elements 9 are optical thin bodies that are arranged on the incident side and the emission side of the projection optical system 6 so as to supplementarily improve the imaging performance of the projection optical system 6 or the like. As the material of the flat plate-type transmission element 9, a quartz glass or the like having a substantially zero level of internal absorption of exposure light may be employed. Each of the reflection mirror 10, the concave mirror 11, and the convex mirror 12 is a member for reflecting a pattern image, and the material thereof is a glass having a small linear expansion coefficient. Here, given that the projection optical system 6 is used at a projection magnification of 1:1, the exposure apparatus 1 performs exposure by synchronous scanning of the mask M and the glass plate P in the X-axis direction while changing an exposure light irradiation area on the mask M to thereby be able to transfer a pattern formed on the mask M onto a glass plate. A substrate stage (substrate holding unit) 7 is movable in the X-Y plane while holding the glass plate P by, for example, vacuum adsorption. Also, the control unit 8 may control the operation and adjustment of the components of the exposure apparatus 1. The control unit 8 is constituted, for example, by a computer or the like and is connected to the components of the exposure apparatus 1 via a line to thereby execute control of the components in accordance with a program or the like. The control unit 8 of the present embodiment controls at least the operation of the mask stage 5. Note that the control unit 8 may be integrated with the rest of the exposure apparatus 1 or may be installed at a location separate from the location where the rest of the exposure apparatus 1 is installed.

Figure 2A:
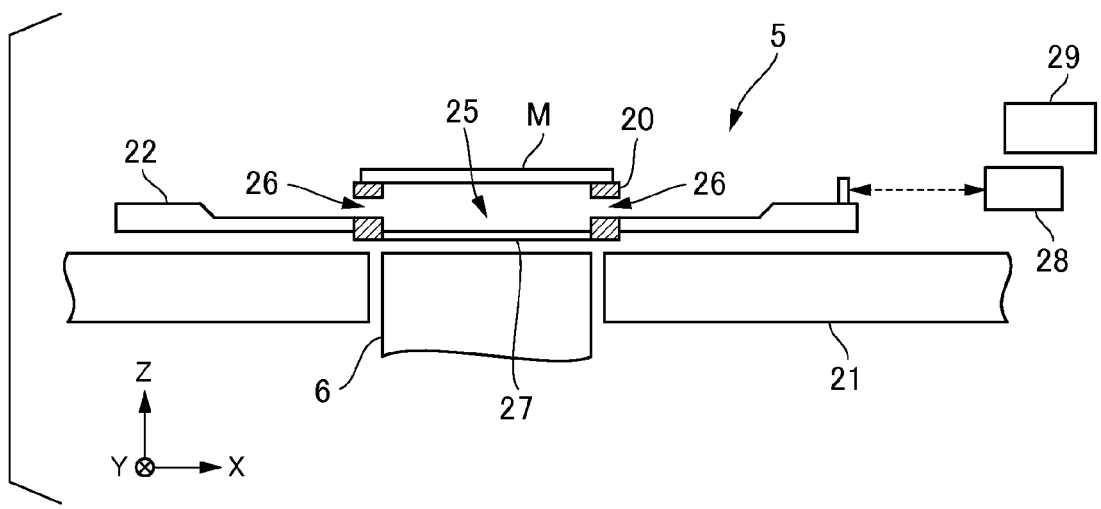
FIG. 2A is a diagram illustrating the configuration of a mask stage according to a first embodiment.
Figure 2B:
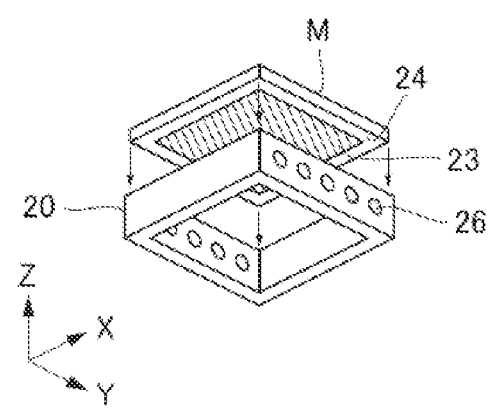
FIG. 2B is a diagram illustrating the shapes of a mask and a holding frame according to the first embodiment.
Figure 2C:
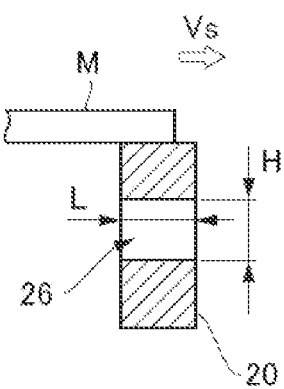
FIG. 2C is a diagram illustrating the configuration of a mask stage according to the first embodiment.

Next, a detailed description will be given of the configuration of the mask stage 5. FIGS. 2A to 2C are schematic cross-sectional views illustrating the configuration of the mask stage 5. As shown in FIG. 2A, the mask stage 5 includes a holding frame 20 that attracts and holds the mask M and a drive unit 22 on which the holding frame 20 is fixed and that is movable in the XY direction using a mask stage plate (hereinafter referred to as "plate") 21 as a reference plane. Also, the light-emitting section of the projection optical system 6 is positioned at the center of the plate 21 such that the light-emitting section can optically face the mask M.

FIG. 2B is a perspective view illustrating the shapes of the mask M and the holding frame 20. The mask M has a circuit pattern 23 on the irradiated exposure light exiting side. The circuit pattern 23 has been drawn in advance using a light-shielding material such as chromium. The circuit pattern 23 is drawn on the entire surface of the effective area excluding a holding region 24 of the mask M positioned at the outer peripheral portion of the circuit pattern 23 so as to maximize the drawing area. Since the entire surface of the circuit pattern 23 is illuminated by a step-and-scan system during exposure processing, a member for shielding the circuit pattern 23 must not be present. Thus, the holding frame 20 has, for example, a punched rectangular frame body. Also, from the viewpoint of preventing the mask M from being dropped off by gravity, the holding frame 20 has an adsorption section (crimping section) such that the holding region 24 of the mask M becomes the lower surface in the direction of gravity. Accordingly, from the shape of the holding frame 20, a space 25 defined by the mask M and the holding frame 20 is formed on the light-exiting surface side of the mask M. As a holding mechanism for holding the mask M in the holding frame 20, a mechanism utilizing a vacuum adsorption force or an electrostatic attraction force, a mechanism utilizing an actuator for generating a pressing force, or the like may be employed. However, in the present invention, such a holding mechanism is not particularly limited thereto.

Here, the holding frame 20 of the present embodiment has a penetrating portion 26 that is provided at both front and back lateral sides of the holding frame 20 in the direction (scanning direction) of movement thereof during scanning driving (during synchronous scanning), i.e., at both lateral sides of the holding frame 20 in the X-axis direction. The penetrating portion 26 communicates between the space 25 and the peripheral portion of the mask stage 5 and is capable of naturally exhausting gas in the space 25 to the outside in association with the scanning drive of the drive unit 22. In this case, the shape of the penetrating portion 26 may be a shape in which a plurality of holes is arrayed as shown in FIG. 2B or may also be a slit-like shape. Thus, the shape of the penetrating portion 26 and the number of penetrating portions 26 to be installed are not particularly limited but may be preferably determined by taking the rigidity of the holding frame 20 and permeability during use of the apparatus into consideration. For example, when the shape of the penetrating portion 26 is a slit, it is assumed that the opening width (opening height) of the penetrating portion 26 is "H", the length (thickness) of the penetrating portion 26 in the flow direction is "L", the drive speed of the drive unit 22 is "$V_s$", and the kinematic viscosity coefficient is "$v$" as shown in FIG. 2C. At this time, from the viewpoint of the thickness of a flat plate laminar boundary layer, it is preferable that the opening width H satisfies the relationship represented by the following Formula 1. Furthermore, a filter for inhibiting inflow of particles from the peripheral portion of the mask stage 5 to the space 25 may also be provided near the through region of the penetrating portion 26.

$$\frac{H}{2} > 5.48\sqrt{\frac{Lv}{V_s}} \quad \text{[Formula 1]}$$

Also, the holding frame 20 includes a transmitting plate (light transmissive member) 27 that is provided on the side opposite to the mask M-holding side. The transmitting plate 27 shields the opening surface of the space 25 while being capable of transmitting light transmitted through or reflected from the mask M. The transmitting plate 27 may be fixed to the holding frame 20 in advance or may also be relatively movable or detachable separately from the holding frame 20 in the exposure apparatus 1. For example, when the transmitting plate 27 impedes measurement of the surface of the mask M by the alignment measurement system 4, measurement processing may be performed after the transmitting plate 27 has temporarily been moved and exposure processing may be performed after the transmitting plate 27 has been returned to a predetermined position again.

As shown in FIG. 2A, the drive unit 22 is movable while fixing the holding frame 20 from its lateral sides. In the present embodiment, although the holding frame 20 is distinguished from the drive unit 22 for convenience, the holding frame 20 may also be integrated with the drive unit 22. Alternatively, the drive unit 22 may also be able to perform fine movement positioning of the holding frame 20. As a drive mechanism of the drive unit 22, a linear motor with respect to the plate 21 may be employed. In order to suppress airflow disturbance in association with scanning driving, it is preferable that the bottom surfaces of the movable components such as the holding frame 20, the drive unit 22, and the transmitting plate 27 are the substantially same level. Also, the position of the mask stage 5 is measured by a light measuring device 28. For example, when the mask stage 5 moves in the X-axis direction, it is preferable that the light measuring device 28 is provided at a position along the X-axis direction as shown in FIG. 2A. As the light measuring device 28, an encoder-type light measuring device or a laser interference-type light measuring device may be employed.

Figure 3A:
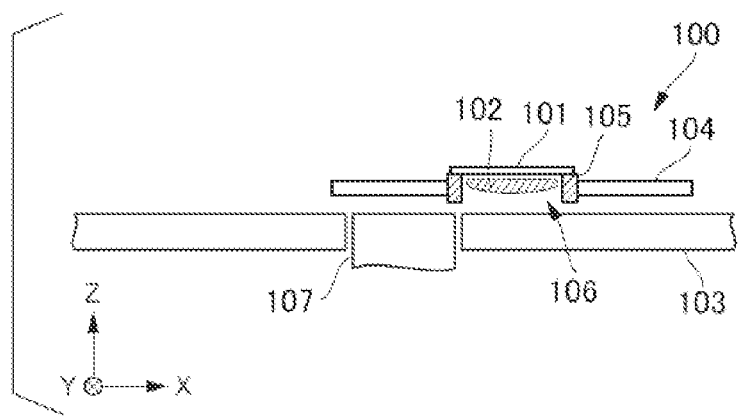
FIGS. 3A to 3E are diagrams illustrating the flow of gas retaining at a lower portion of a mask in the conventional exposure apparatus.
Figure 3B:
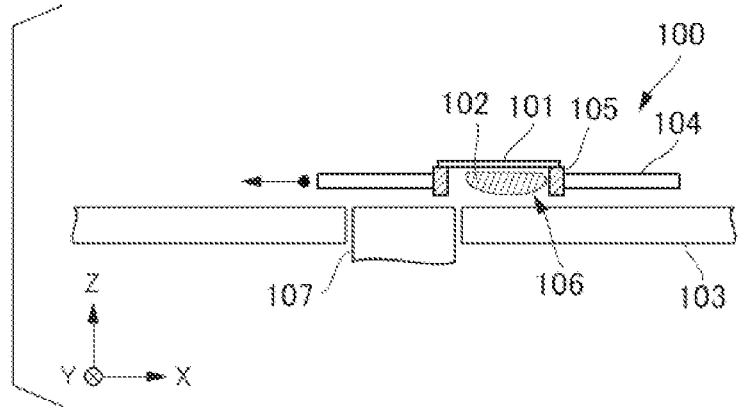
Figure 3C:
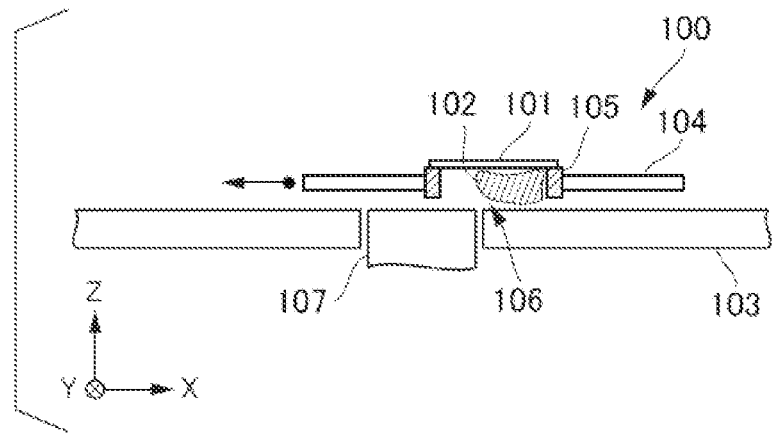
Figure 3D:
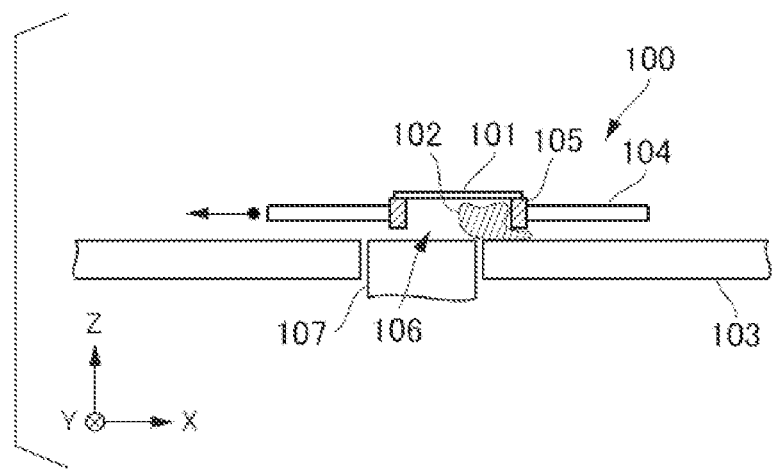
Figure 3E:
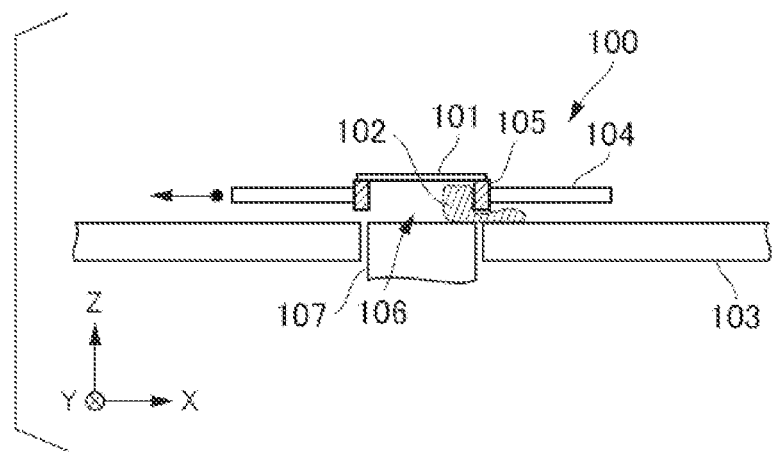

Next, a description will be given of operation of the mask stage 5 which is a feature of the exposure apparatus 1 according to the present embodiment. In general, when exposure light is irradiated onto a mask during exposure processing, a portion of exposure light is absorbed by a circuit pattern, and thus, light energy is converted into heat energy. Consequently, the heat energy may cause a thermal deformation of the mask and be diffused into the surrounding environment through solid heat transfer via the mask itself and the holding frame, convection heat transfer via the surrounding air, or radiative heat transfer. In particular, in the exposure apparatus employing a step-and-scan system, gas present in a space such as the space 25 shown in FIG. 2A is heated by a mask, and thus, the gas is leaked out in association with the scanning drive of a mask stage (drive unit), resulting in a high probability of disturbing the surrounding environment. FIGS. 3A to 3E are schematic cross-sectional views illustrating the configuration of a mask stage 100 provided in the conventional exposure apparatus and are diagrams illustrating the flow of gas 102 retaining at a lower portion of a mask 101. In FIGS. 3A to 3E, the flow of the gas 102 retaining at the lower portion is shown in a time-series manner and the mask stage 100 is scanning-driven by a drive unit 104 on a mask stage plate 103 in the X-axis direction from the right side to the left side of the drawing sheet. Firstly, as shown in FIG. 3A, the heated gas 102 is retained in a space 106 defined by a holding frame 105 which is fixed to the drive unit 104 while holding the mask 101 and the mask 101. When the drive unit 104 gradually moves from the state shown in FIG. 3A to the state shown in FIGS. 3B to 3E, the gas 102 retained in the space 106 is leaked out from the gap between the both of a projection optical system 107 and the mask stage plate 103 and the holding frame 105 and diffused into the surrounding environment. When the heated gas 102 is diffused into the surrounding environment, the peripheral components may be affected by the heat. More specifically, for example, the diffused heat may reduce the measurement accuracy of the alignment measurement system or when a laser interference-type light measuring device with a high sensitivity for heat fluctuation on a measurement optical path is employed, the diffused heat may reduce the measurement accuracy of the light measuring device. In addition, the fluctuation may occur to light directed from the mask 101 toward the projection optical system 107. Furthermore, the thermal deformation of the mask 101 itself may also directly and adversely affect imaging performance.

Therefore, in the exposure apparatus 1 of the present embodiment, the holding frame 20 provided on the mask stage 5 has the penetrating portion 26 as described above with reference to FIGS. 2A to 2C. For example, when the drive unit 22 is scanning-driven in the X-axis direction with the penetrating portion 26 provided in the holding frame 20, the peripheral gas is flown into the space 25 from one side of the penetrating portion 26 and the gas existed in the space 25 is flown out from the other side of the penetrating portion 26 to the periphery thereof. Thus, even if the gas in the space 25 is heated to some extent during exposure processing, the gas is exhausted to the outside of the space 25 without being retained and heated in the space 25, and thus, is not excessively heated. Consequently, the adverse effects of heat can be suppressed as small as possible. Also, an air conditioner 29 may be provided within the interior of the exposure apparatus 1, i.e., around the periphery of the mask stage 5. It is preferable that the air conditioner 29 supplies gas in a predetermined direction, i.e., a direction opposite to the scanning direction of the drive unit 22 while passing at least through near the mask M. In this manner, the gas flown out from the space 25 can be efficiently exhausted to the exterior of the exposure apparatus 1, and thus, the environment of the overall space where the mask stage 5 is present may be preferably maintained.

Also, the mask stage 5 has the transmitting plate 27 provided at the lower portion of the space 25, and thus, the gas present in the space 25 can be prevented from being leaked out on the projection optical system 6 and the plate 21. Furthermore, the transmitting plate 27 is separate from the mask M, and thus, the transmitting plate 27 is not affected by the exchange of the mask M. Hence, the mask M does not need to have any special configuration.

Furthermore, the penetrating portion 26 of the present embodiment does not have any piping connected from an external device (temperature-adjusting device or exhaust device) that forcibly introduces a temperature-adjusting gas into the space 25 or forcibly exhausts the gas in the space 25. Thus, neither vibration of the piping itself nor external vibration transmitted via the piping is transmitted to the mask M. In this manner, the influence of vibration transmitted to the mask M may be suppressed or the breakage of an anti-adhesion film due to vibration may also be prevented when the anti-adhesion film (pellicle) is provided onto the holding frame 20. Furthermore, since such piping described above is not provided, various loads on the exposure apparatus 1, such as a mechanical load on the mask M due to the laying of the piping or the connection of the piping, detachment of the piping during the exchange of the mask M, and the occurrence of particles in association with the detachment, can be reduced.

As described above, according to the present embodiment, an exposure apparatus that is advantageous for suppressing the effects of heat and vibration on the mask M may be provided.

Second Embodiment

Next, a description will be given of an exposure apparatus according to the second embodiment of the present invention. Although the penetrating portion 26 is provided with the holding frame 20 for the mask stage 5 in the first embodiment described above, it is preferable that the flow of gas passing through the space 25 via the penetrating portion 26 is defined in a fixed direction in order to efficiently exhaust gas retained in the space 25 to the outside. For example, when the flow of gas is produced by the air conditioner 29 from the periphery and the side of the mask stage 5, it is preferable that gas passes through the space 25 while flowing along the main direction of gas flow produced by the air conditioner 29. Hence, in the present embodiment, two penetrating portions provided at both lateral sides of the holding frame 20 in a certain axial direction have a shape or a configuration such that the flow of gas passing through the space 25 is defined in a fixed direction. In other words, the penetrating portion of the present embodiment has a shape or a configuration such that the pressure loss in the flow of gas in a direction (second direction) from the other side of a certain axial direction becomes greater than that in the flow of gas in a direction (first direction) from one side thereof.

Figure 4A:
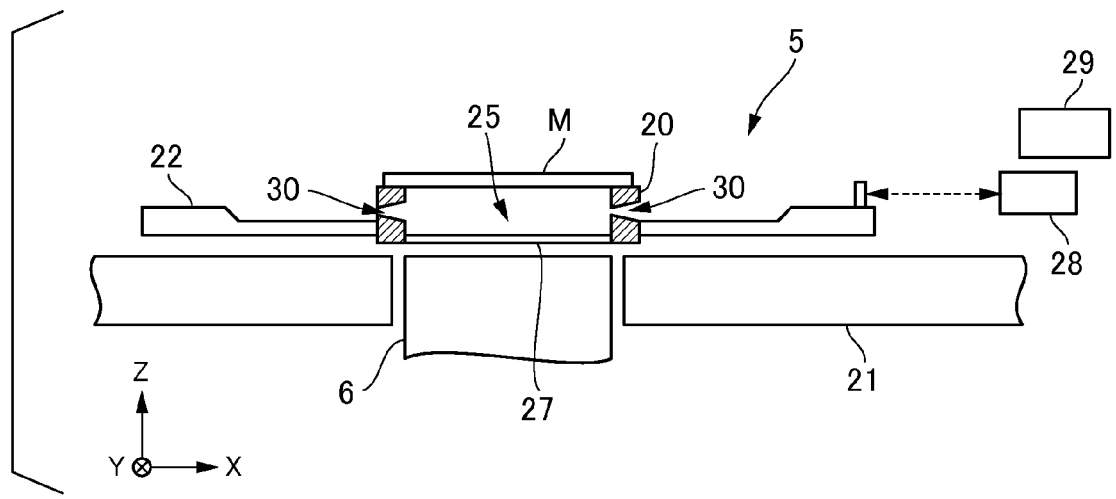
FIG. 4A is a diagram illustrating the configuration of a mask stage according to a second embodiment.
Figure 4B:
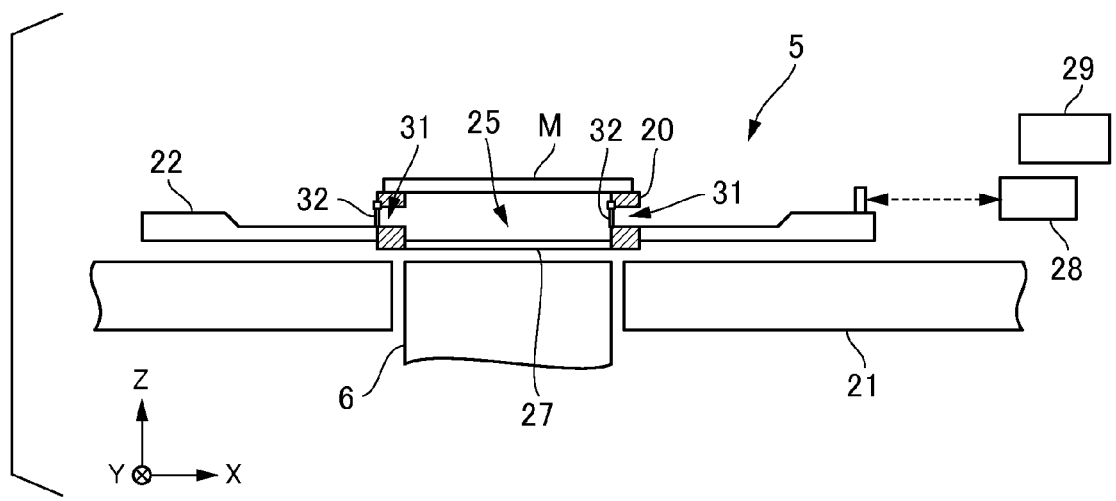
FIG. 4B is a diagram illustrating the configuration of a mask stage having a penetrating portion according to the second embodiment.

FIGS. 4A and 4B are schematic cross-sectional views illustrating the configuration of the mask stage 5 according to the present embodiment. Firstly, the mask stage 5 shown in FIG. 4A has a penetrating portion 30 as a first example. In FIGS. 4A and 4B, the same elements as those shown in FIGS. 2A to 2C according to the first embodiment are designated by the same reference numerals and explanation thereof will be omitted. The penetrating portion 30 has a shape different from that of the penetrating portion 26 of the first embodiment. The penetrating portion 30 has a tapered shape which is open in one direction so as to have flow resistance anisotropy. When the forward speed of the drive unit 22 is the same as the return speed thereof, the shape allows the fact that the flow rate of gas with respect to the expanding direction of the penetrating portion 30 becomes small and the flow rate of gas with respect to the contracting direction thereof becomes large. The differences between flow rates are caused by a local pressure distribution in the penetrating portion 30 or delamination phenomena. In the example shown in FIG. 4A, assume that the X-axis direction is the scanning direction and the direction of the flow of gas created by the air conditioner 29 is in a direction from the right side to the left side of the drawing sheet, i.e., in a direction opposite to the scanning direction in the X-axis direction. In this case, it is preferable that the penetrating portion 30 has a tapered shape having a wide opening on the inflow side of gas on the right side of the drawing sheet and a narrow opening on the outflow side of gas on the left side of the drawing sheet. In this manner, the pressure loss of gas from the right side to the left side of the drawing sheet becomes small, and thus, the gas in the space 25 is readily flown out from the penetrating portion 30 on the left side.

On the other hand, the mask stage 5 shown in FIG. 4B has a penetrating portion 31 as a second example. The penetrating portion 31 has a configuration different from that of the penetrating portion 26 of the first embodiment. The penetrating portion 31 includes a check valve 32 that defines the direction of the flow of the gas in a certain fixed direction, for example, in the first direction. The check valve 32 may be controlled to open/close by electrical means so as to be able to adjust the flow rate of gas as appropriate or may also naturally open/close by the fluid force of gas caused by the scanning drive of the drive unit 22. Also, in this case, as in the first example, the gas in the space 25 is readily flown out from the penetrating portion 31 on the left side.

Third Embodiment

Figure 5:
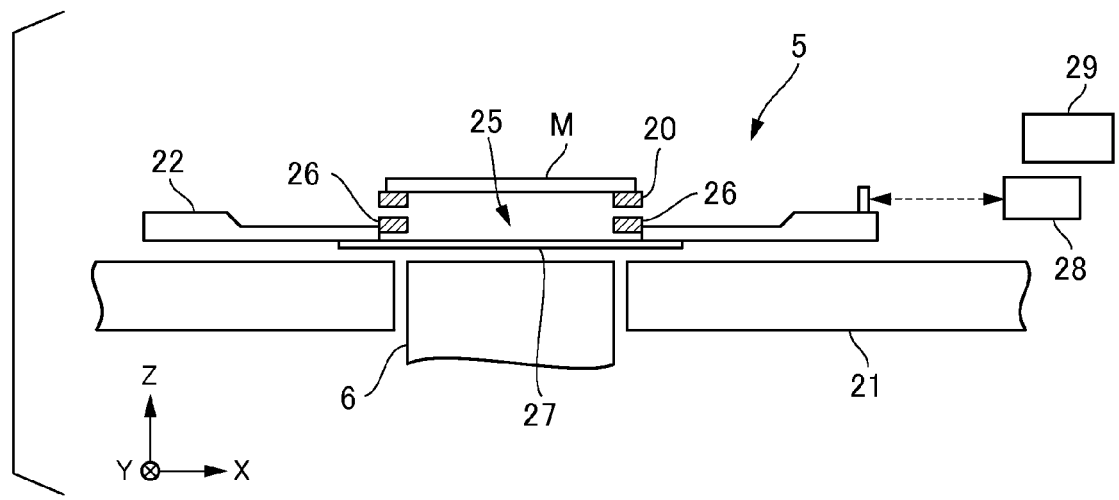
FIG. 5 is a diagram illustrating the configuration of a mask stage according to a third embodiment.

Next, a description will be given of an exposure apparatus according to the third embodiment of the present invention. FIG. 5 is a schematic cross-sectional view illustrating the configuration of the mask stage 5 according to the present embodiment. In FIG. 5, the same elements as those shown in FIGS. 2A to 2C according to the first embodiment are designated by the same reference numerals and explanation thereof will be omitted. In general, the position of the mask M is determined by the fine movement positioning under the drive of the drive unit 22. Thus, it is preferable that the peripheral member of the mask M such as the holding frame 20 or the like is not affected by a mechanical load from outside as small as possible so as not to influence the fine movement positioning. Accordingly, in the present embodiment, as shown in FIG. 5, the transmitting plate 27 is supported by the drive unit 22 without being in direct contact with the holding frame 20 so that a mechanical load on the holding frame 20 from the transmitting plate 27 is reduced. Such configuration becomes effective particularly when the transmitting plate 27 is movable or detachable separately from the holding frame 20 in the exposure apparatus 1.

Figure 6A:
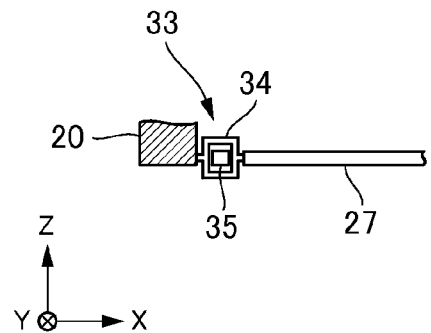
FIG. 6A is a diagram illustrating the configuration of a holding frame having a support unit according to the third embodiment.
Figure 6B:
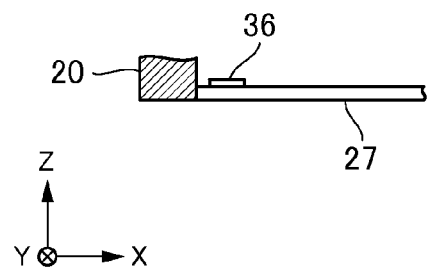
FIG. 6B is a diagram illustrating the configuration of a holding frame having a temperature adjusting unit according to the third embodiment.

Furthermore, the transmitting plate 27, which is effectively a portion of an optical system, is deformed upon receiving thermal influences, resulting in an adverse effect on optical performance. Accordingly, the thermal influences on the transmitting plate 27 are suppressed by adopting the following configuration. FIGS. 6A and 6B are schematic cross-sectional views illustrating the configuration of a support unit (connection) for supporting the transmitting plate 27 in the holding frame 20. Firstly, the holding frame 20 shown in FIG. 6A has a support unit 33 that suppresses deformation of the transmitting plate 27 by preventing heat from being transferred to the transmitting plate 27. As the support unit 33, for example, an elastic member 34 that flexibly supports the transmitting plate 27, an actuator (shape correction mechanism) 35 that is capable of dynamically correcting deformation occurred along the transmitting plate 27, or the like may be employed. On the other hand, the holding frame 20 shown in FIG. 6B supports the transmitting plate 27 in the same manner as the first embodiment and has a temperature adjusting unit 36 that is capable of adjusting the temperature of the transmitting plate 27. As the temperature adjusting unit 36, a Peltier element may be employed. The Peltier element is a heat transfer element having a heat absorbing surface and a heat generating surface. The heat absorbing surface is brought into contact with the surface of the transmitting plate 27 for cooling and the heat generating surface is exposed at the space 25 so as to dissipate unwanted heat, resulting in a reduction in thermal influences on the transmitting plate 27.

Although the exposure apparatus 1 of the aforementioned embodiment is intended to employ a step-and-scan system, the present invention is not limited thereto. For example, even in a step-and-repeat type exposure apparatus in which the mask stage 5 and the substrate stage 7 do not undergo synchronous scanning, it may be advantageous that the holding frame 20 has the penetrating portion 26 from the viewpoint of the flow of gas caused by the movement of the mask stage 5 upon exchange of the mask M.

Although, in the embodiment, the transmitting plate 27 is provided on the holding frame 20, the transmitting plate 27 is not necessarily provided thereon. As described above, the transmitting plate 27 is advantageous due to the fact that the gas present in the space 25 can be suppressed from being leaked out on the projection optical system 6 and the plate 21. In contrast, for example, another configuration in which only a penetrating portion 26 is provided with the holding frame 20 without providing the transmitting plate 27 thereon may also be advantageous due to the fact that the gas present in the space 25 can be exhausted to the outside.

Other Embodiments

Next, a method of manufacturing a device (semiconductor device, liquid crystal display device, etc.) as an embodiment of the present invention is described. The semiconductor device is manufactured through a front-end process in which an integrated circuit is formed on a wafer, and a back-end process in which an integrated circuit chip is completed as a product from the integrated circuit on the wafer formed in the front-end process. The front-end process includes a step of exposing a wafer coated with a photoresist to light using the above-described exposure apparatus of the present invention, and a step of developing the exposed wafer. The back-end process includes an assembly step (dicing and bonding), and a packaging step (sealing). The liquid crystal display device is manufactured through a process in which a transparent electrode is formed. The process of forming a plurality of transparent electrodes includes a step of coating a glass substrate with a transparent conductive film deposited thereon with a photoresist, a step of exposing the glass substrate coated with the photoresist thereon to light using the above-described exposure apparatus, and a step of developing the exposed glass substrate. The device manufacturing method of this embodiment has an advantage, as compared with a conventional device manufacturing method, in at least one of performance, quality, productivity and production cost of a device.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-160982 filed Jul. 22, 2011 which is hereby incorporated by reference herein it its entirety.

What is claimed is:

1. An exposure apparatus that irradiates a pattern formed on an original with light emitted from an illumination system, projects an image of the pattern on a substrate via a projection optical system, and exposes the substrate, the exposure apparatus comprising:
    an original holding unit including a holding frame and configured to move in a first direction and a second direction opposite to the first direction; and
    a measuring device configured to measure a position of the original holding unit,
    wherein the holding frame has a first penetrating portion provided at a front lateral side of the holding frame and a second penetrating portion provided at a back lateral side of the holding frame, each of the first and second penetrating portions being configured to allow gas present in a space defined by the original and the holding frame to flow into and out from the space while the original holding unit is being moved in the first and second directions,
    wherein both the first and second penetrating portions are configured to allow a pressure loss in the flow of the gas in the first direction caused by moving the original holding unit in the second direction to be less than the pressure loss in the flow of the gas in the second direction caused by moving the original holding unit in the first direction, and
    wherein the measuring device is arranged at a side toward the second direction of the original holding unit.

2. The exposure apparatus according to claim 1, wherein each of the first and second penetrating portions is a hole or a slit extending through the lateral sides.

3. The exposure apparatus according to claim 1, wherein the first penetrating portion allows gas passage from the periphery of the original holding unit to the space in accordance with the movement of the holding frame in the second direction and the second penetrating portion allows gas passage, which is present in the space, from the space to the periphery of the original holding unit in accordance with the movement of the holding frame in the second direction.

4. The exposure apparatus according to claim 1, further comprising:
    a substrate holding unit configured to movably hold the substrate,
    wherein, when exposure processing is performed during synchronous scanning of the original holding unit and the substrate holding unit, the second direction is a scanning direction along which the original holding unit is scanned.

5. The exposure apparatus according to claim 1, wherein:
    each of the first and second penetrating portions have a tapered shape having a wide opening and a narrow opening, and tapering from the wide opening to the narrow opening in both the first and second penetration portions being in the same direction along the flow of the gas in the first direction.

6. The exposure apparatus according to claim 1, wherein each of the first and second penetrating portions have a check valve that defines the direction of the flow of the gas in the first direction.

7. The exposure apparatus according to claim 1, further comprising a light transmissive member that is supported by the holding frame and is arranged between the original and the projection optical system while transmitting the light emitted from the illumination system.

8. The exposure apparatus according to claim 7, wherein the light transmissive member is relatively movable with respect to the holding frame.

9. The exposure apparatus according to claim 7, wherein the light transmissive member is supported via an elastic member.

10. The exposure apparatus according to claim 7, wherein the light transmissive member is supported via a shape correction mechanism.

11. The exposure apparatus according to claim 7, wherein the light transmissive member has a temperature adjusting unit, which adjusts the temperature of the light transmissive member, provided on the surface thereof.

12. The exposure apparatus according to claim 1, further comprising:
an air conditioner that is provided around the original holding unit and adjusts the temperature of the surrounding environment of the original holding unit,
wherein the air conditioner supplies gas in a predetermined direction while passing through the periphery of the original.

13. An exposure apparatus that irradiates a pattern formed on an original with light emitted from an illumination system, projects an image of the pattern on a substrate via a projection optical system, and exposes the substrate, the exposure apparatus comprising:
an original holding unit including a holding frame and configured to move in a first direction and a second direction opposite to the first direction; and
a measuring device configured to measure a position of the original holding unit,
wherein the holding frame has a first penetrating portion provided at a front lateral side of the holding frame and a second penetrating portion provided at a back lateral side of the holding frame, each of the first and second penetrating portions being configured to allow gas present in a space defined by the original and the holding frame to flow into and out from the space while the holding frame is being moved in the first and second directions,
wherein both the first and second penetrating portions are configured to allow an amount of the gas flowing therethrough in the first direction caused by moving the original holding unit in the second direction to be larger than the amount of the gas flowing therethrough in the second direction caused by moving the original holding unit in the first direction, and
wherein the measuring device is arranged at a side toward the second direction of the original holding unit.

14. A device manufacturing method comprising the steps of:
exposing a substrate using an exposure apparatus; and developing the exposed substrate,
wherein the exposure apparatus irradiates a pattern formed on an original with light emitted from an illumination system, projects an image of the pattern on the substrate via a projection optical system, and exposes the substrate,
wherein the exposure apparatus comprises:
an original holding unit including a holding frame and configured to move in a first direction and a second direction opposite to the first direction,
a measuring device configured to measure a position of the original holding unit,
wherein the holding frame has a first penetrating portion provided at a front lateral side of the holding frame and a second penetrating portion provided at a back lateral side of the holding frame, each of the first and second penetrating portions being configured to allow gas present in a space defined by the original and the holding frame to flow into and out from the space while the original holding unit is being moved in the first and second directions,
wherein both the first and second penetrating portions are configured to allow a pressure loss in the flow of the gas in the first direction caused by moving the original holding unit in the second direction to be less than the pressure loss in the flow of the gas in the second direction caused by moving the original holding unit in the first direction, and
wherein the measuring device is arranged at a side toward the second direction of the original holding unit.

15. A device manufacturing method comprising the steps of:
exposing a substrate using an exposure apparatus; and developing the exposed substrate,
wherein the exposure apparatus irradiates a pattern formed on an original with light emitted from an illumination system, projects an image of the pattern on a substrate via a projection optical system, and exposes the substrate,
wherein the exposure apparatus comprises:
an original holding unit including a holding frame and configured to move in a first direction and a second direction opposite to the first direction,
a measuring device configured to measure a position of the original holding unit,
wherein the holding frame has a first penetrating portion provided at a front lateral side of the holding frame and a second penetrating portion provided at a back lateral side of the holding frame, each of the first and second penetrating portions being configured to allow gas present in a space defined by the original and the holding frame to flow into and out from the space while the holding frame is being moved in the first and second directions,
wherein both the first and second penetrating portions are configured to allow an amount of the gas flowing therethrough in the first direction caused by moving the original holding unit in the second direction to be larger than the amount of the gas flowing therethrough in the second direction caused by moving the original holding unit in the first direction, and
wherein the measuring device is arranged at a side toward the second direction of the holding unit.

* * * * *